US005619460A

United States Patent [19]
Kirihata et al.

[11] Patent Number: 5,619,460
[45] Date of Patent: Apr. 8, 1997

[54] METHOD OF TESTING A RANDOM ACCESS MEMORY

[75] Inventors: Toshiaki Kirihata, Wappingers Falls, N.Y.; Hing Wong, Norwalk, Conn.

[73] Assignee: International Business Machines Corporation, Armonk, N.Y.

[21] Appl. No.: 477,061

[22] Filed: Jun. 7, 1995

[51] Int. Cl.$^6$ .................................................. G11C 29/00
[52] U.S. Cl. ............... 365/201; 365/189.07; 365/230.03; 365/200
[58] Field of Search .................... 365/200, 201, 365/230.03, 189.01, 189.07

[56] References Cited

U.S. PATENT DOCUMENTS

| | | | |
|---|---|---|---|
| Re. 34,718 | 9/1994 | Tobita | 365/201 |
| 4,654,849 | 3/1987 | White, Jr. et al. | 371/21 |
| 4,868,823 | 9/1989 | White, Jr. et al. | 371/21.3 |
| 4,905,194 | 2/1990 | Ohtsuka et al. | 365/239.06 |
| 5,053,999 | 10/1991 | Matsumura et al. | 365/189.01 |
| 5,185,722 | 2/1993 | Ota et al. | 365/201 |
| 5,258,954 | 11/1993 | Furuyama | 365/201 |
| 5,265,100 | 11/1993 | McClure et al. | 371/21.1 |
| 5,276,647 | 1/1994 | Matsui et al. | 365/201 |
| 5,301,155 | 4/1994 | Wada et al. | 365/201 |
| 5,311,473 | 5/1994 | McClure et al. | 365/201 |
| 5,315,553 | 5/1994 | Morris | 365/201 |
| 5,371,712 | 12/1994 | Oguchi et al. | 365/201 |
| 5,465,234 | 11/1995 | Hannai | 365/230.03 |
| 5,475,640 | 12/1995 | Kersh, III et al. | 365/200 |

Primary Examiner—Tan T. Nguyen
Attorney, Agent, or Firm—Charles W. Peterson, Jr.

[57] ABSTRACT

A method of testing a RAM. The RAM array is arranged in rows and columns. The rows are grouped into word line groups. The method includes the steps of: a) asserting an array select signal; b) selecting a group of rows in the array; c) selecting at least one row of the selected group of rows; and, d) repeating steps b and c until all of the groups are selected. Array Sense Amps may be set when the first group is selected and remain set until the last group is selected. In one test, word lines in all of the selected rows are activated and remain activated until the final selected row is selected. In a second test, word lines in selected groups are toggled with RAS. If a group contains a known defective word line, that group is either not addressed or its selection is disabled. In each selected group, one row, alternating rows or, all of the rows may be selected.

9 Claims, 11 Drawing Sheets

METHOD OF TESTING A RANDOM ACCESS MEMORY

RELATED APPLICATION

This application is related to application Ser. No. 08/477,063 to Kirihata, et al., entitled "Latched Row Decoder for A Random Access Memory", assigned to the Assignee of the present Application and filed coincident herewith and incorporated herein by reference.

FIELD OF THE INVENTION

The present invention relates generally to semiconductor memories and more particularly to testing semiconductor memories.

BACKGROUND OF THE INVENTION

Memory cell defects and memory array defects have many sources and, as a result, many signatures. While single, isolated cell failures may be spread throughout the array, very often, multiple cells in the same vicinity fail. When multi-cell failures occur, the failure may be characterized as a word line failure, (i.e. failing cells with the same word line address), a bit (or column) line failure (i.e. failing cells with the same bit address), or both. The sources of these multi-cell failures vary. Consequently, memory arrays are tested extensively to identify defective cells.

Very often, chips with defective cells can be repaired. Once identified, defective cells can be replaced, electrically, with spare cells, provided spare cells are included in the array. Providing on-chip spare cells to repair cell failures is known in the art as on-chip redundancy. A typical state of the art redundancy scheme has one or more spare rows (row redundancy) and/or one or more spare columns (column redundancy). These spare rows/columns have fuse programmable decoders that can be programmed to be responsive to the address of the defective row/column, while simultaneously disabling selection of the row/column with the defective cell. Electrically, a repaired chip cannot be discerned from a completely good chip.

Figure 1:
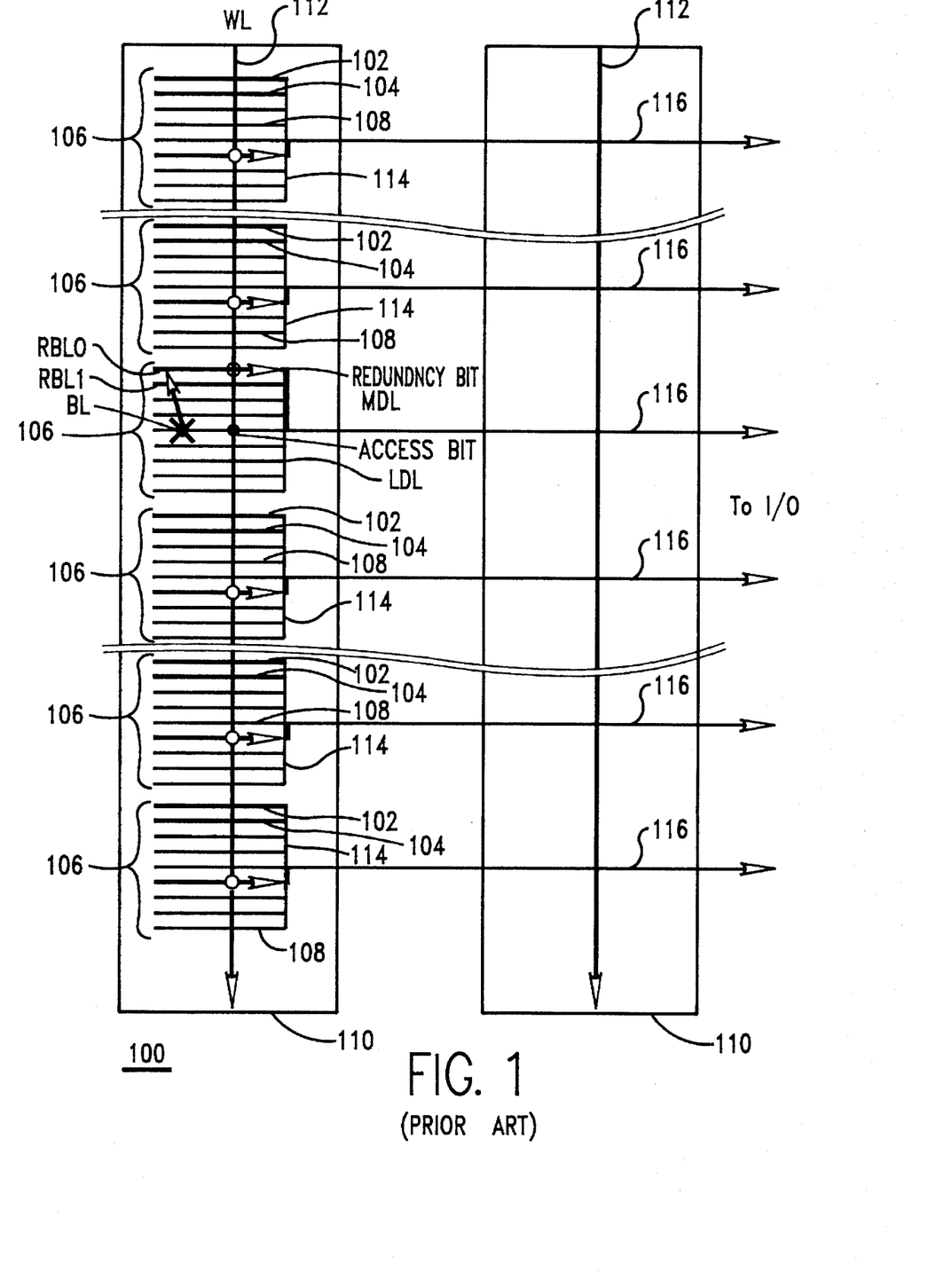
FIG. 1 is a schematic representation of a prior art RAM array.

FIG. 1 is a schematic representation of a prior art 16 Mb DRAM chip. The chip 100 is organized with two Redundant Bit Lines (RBL) 102 and 104 providing two spare columns in each subarray 106. Each subarray 106 includes $2^n$ Bit Lines (BL) 108 (where n is typically between 5 and 8) and redundant bit lines (2 in this example). Each of the subarrays 106 is part of a subarray block 110. All of the subarray blocks 110, collectively, form the entire RAM array. So, for example, a 16 Mb RAM has 16 blocks 110 of 1 Mb each. Block size, subarray size and the number of subarrays 106 per block 110 are interdependent and, selected based on performance and logic objectives.

A subarray 106 is accessed when one word line 112 is selected and driven high. Data from accessed cells are provided simultaneously to the bit lines 108 and redundant bit lines 102 and 104. After a predetermined minimum delay, sufficient to allow the redundancy decoder to determine whether a spare column is addressed, a single bit line 108 or a redundant bit line 102, 104 is selected in each subarray 106. In each subarray, the selected bit line 108 or redundant bit line 102, 104 is coupled to a Local Data Line (LDL) 114. LDLs 114 are coupled to Master Data Lines (MDLs) 116. The MDLs 116 couple corresponding subarrays 106 in each subarray block 110. Data is transferred between the subarrays 106 and the chip I/O's on the MDLs 116.

Figure 2A:
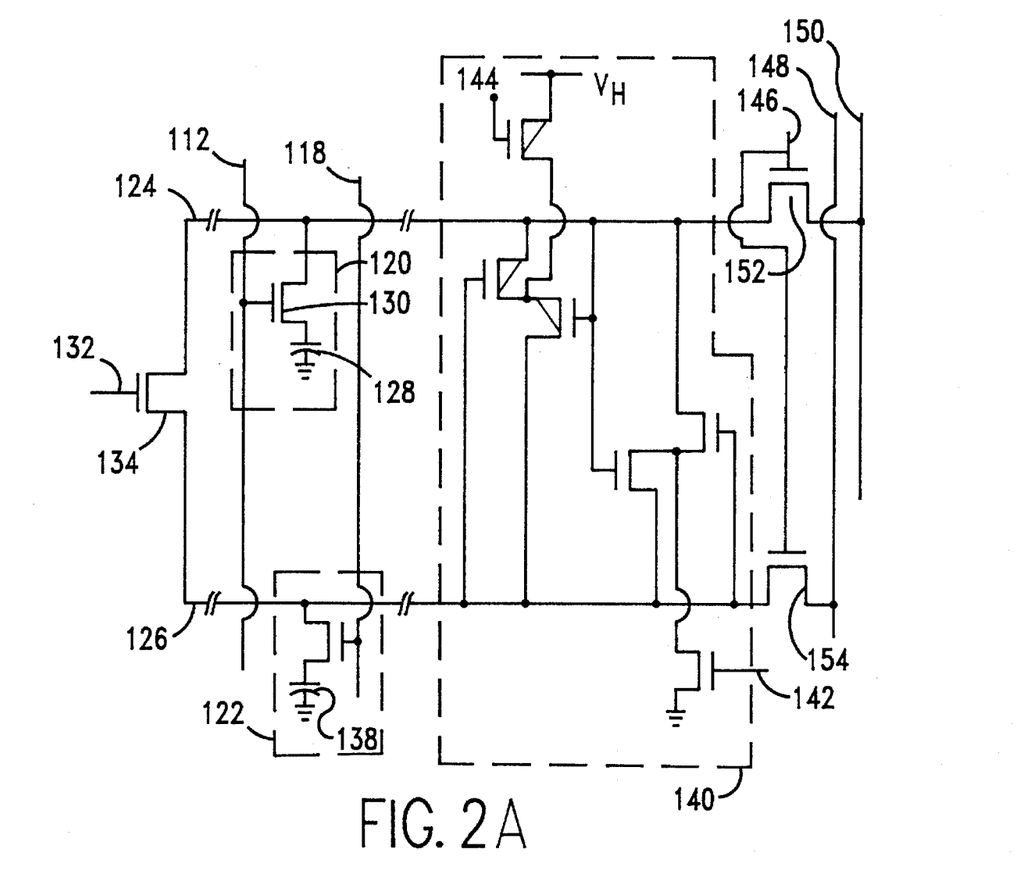
FIG. 2A is a transistor level cross-sectional schematic of a RAM subarray.

FIG. 2 is a transistor level cross-sectional schematic of a subarray 106. Cells 120, 122 connected to adjacent word lines 112, 118 also are connected to opposite lines 124, 126 of each bit line pair. Thus, half of the word lines 112 (e.g., word lines with even addresses) select cells 120 on one line 124 of the bit line pair. While the remaining half of the word lines 118, (odd addressed word lines) select the cells 122 on the other lines 126 of the bit line pair. Each cell's storage capacitor 128 is, typically, a trench capacitor or a stacked structure for density. As is known in the art, the maximum voltage that an FET will pass is its gate to source voltage ($V_{GS}$) reduced by the FET's turn-on or threshold voltage ($V_T$), i.e., $V_{GS}-V_T$. So, if a bit line 124, 126 is charged to the supply voltage level $V_{dd}$ (or $V_H$) and the word line 112, 118 is also at $V_{dd}$, then the largest bit line signal, i.e., the voltage stored on or read from the storage capacitors 128, 138 is $V_{dd}-V_T$. Therefore, to maximize bit line signal, the word line 112, 118 is boosted during a read or a write, typically, to at least $V_{dd}+V_T$ so that $V_{dd}$ is written into/read from the cell. This boosted level, called $V_{pp}$, is normally generated on-chip.

Figure 2B:
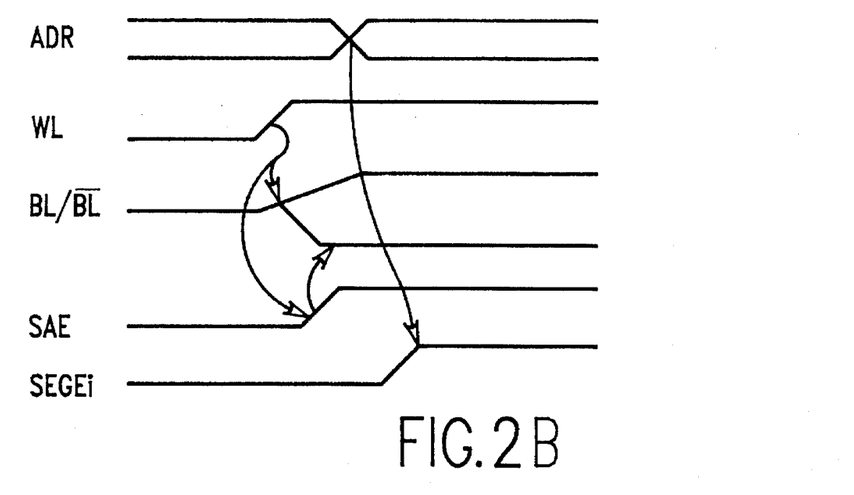
FIG. 2B is a timing diagram for the schematic of FIG. 2A.

Operation of the circuit of FIG. 2A is according to the timing diagram of FIG. 2B. A "one" is stored in the array such that it sets the sense amp in a predefined "one" condition. So, if a "one" is defined as 124 high and 126 low, then a "one" is stored in cell 120 (and all the other cells connected to 124) by charging the cell's storage capacitor 128. Conversely, a "one" is stored in 122 (and all other cells connected to 126) by charging that cell's storage capacitor 138. Prior to selecting a cell 120 or 122, the array is at its steady-state standby condition. The voltage on the bit line pair 124, 126 is equalized to $V_H/2$, with the gate 132 of equalization transistor 134 held high. The Word Lines (WL) 112, 118 and Column SeLect (CSL) lines 146 are held low during standby. In prior art RAMs, each word line was clamped low (unless driven high) by a simple resetable latch (not shown). When a word line 112 (or 118) is driven high, cell pass gate 130 is turned on in each cell 120 on the word line 112, coupling the cell's storage capacitor 128 to line 124 of the pair. Thus charge is transferred between the storage capacitor 128 and line 124. Typically, bit line capacitance is at least one order of magnitude larger than that of the storage capacitor 128. So, the voltage on line 124 rises slightly if a one is stored on storage capacitor 128 or it falls slightly if a zero is stored on the storage capacitor 128. To maximize charge transfer between the bit line 124 and the storage capacitor 128, the word line 112 is boosted to $V_{pp} \geq V_{dd}+V_T$. The other line 126 of the bit line pair remains at its pre-charge voltage level $V_{dd}/2$ and, serves as a reference voltage for the Sense Amplifier 140.

After a delay sufficient that enough charge is transferred to sense "1" or "0", the sense amplifier 140 is set. The sense amp is set by driving both the Sense Amp Enable (SAE) line 142 high and its inverse 144 low. Data transferred to the bit line pair 124, 126 is amplified and redriven on the bit line pair, 124, 126 by setting the sense amplifier forcing 124, 126 High/Low or Low/High depending on data stored in the cell 120. Setting the sense amp, writes the sensed data back into the selected cell 120. Once all of the bit lines 124, 126 have been redriven by setting the Sense Amplifier, SEGment select signal ($SEGE_i$) rises driving CSL 146 high to select a single column in each accessed subarray 106. A high on CSL 146 connects the selected redriven bit line pair 124, 126 to the LDLs 148, 150 through pass gates 152, 154. CSL timing is substantially identical to $SEGE_i$ but slightly delayed therefrom.

Testing a memory chip to identify failed cells is complicated, requiring special test patterns, designed for identifying each type of failure. Cell defects or weaknesses may cause either hard DC failures or AC (coupling) failures. Typical DC failures are: Leakage between a cell and a Passing Word Line(WL); Bit Line(BL) to WL leakage; WL to Substrate/channel leakage; or, WL to WL leakage. Typical AC failures are noise resulting from capacitive coupling to a WL or Sense Amp (SA) Set.

Many such tests require the simultaneous activation of several word lines in order to reduce test time and, therefore, to reduce cost. One example is the Multiple Word Line Select Test used to test for leakage between cell and a passing WL and between BL and WL. For this test, typically, one or more, but not all, word lines are driven high (activated), simultaneously, while setting the Sense Amps (SA). The activated word lines are held active for an extended period of time (long $t_{RAS}$). For certain defects, cell leakage from a passing activated word line will charge the defective cell's storage capacitor 128, thereby changing the data stored in the cell. Also, for other types of defects, bit line to cell leakage will discharge the defective cell's charged storage capacitor 128, to reduce the stored charge, making the defective cell impossible, or nearly impossible to read and, therefore, identifiable. Since each word line needs to be activated for a relatively long time and because the DRAMs have a large number of word lines, many word lines must be activated simultaneously in this test in order to reduce test time.

Another example is the Transfer Gate Stress Test is used to identify cells with defective or weak gate oxide. For this test, typically, all of the word lines are driven high, above $V_H$, e.g. to $V_{pp}$, while all of the bit lines are forced low, to GND. With all of the word lines at $V_{pp}$ and all bit lines at GND, the gate oxide electric field is maximum. If a gate has defective or weak oxide, a short will form.

Often, tests involving multiple word lines are hampered by abnormally large plate voltage bounce on the storage capacitor plate or by array well voltage bounce, both of which result from simultaneously switching multiple word lines in these prior art DRAMs. These voltage bounces can cause abnormal disturbance to the cells under stress and destroy the data stored in the cell.

Another problem of simultaneously activating multiple word lines is the high probability of word line shorts which can reduce local $V_{pp}$ level through an IR drop. If for example, a word line is shorted to ground, the voltage drop across the supply bus resistance may be very significant. Also, word line to word line shorts may occur. Such shorts produce unreliable and unpredictable test results. However, in prior art DRAMs, selecting defective word lines, even if previously identified and replaced, is unavoidable during the above multiple word line tests. Thus, there is a need for RAMs wherein multiple word lines may be tested more easily, flexibly and reliably.

PURPOSES OF THE INVENTION

It is a purpose of the present invention to reduce semiconductor memory test time.

It is another purpose of the present invention to simplify semiconductor memory test.

It is yet another purpose of the present invention to reduce the time required to identify defective semiconductor memory chips.

It is yet another purpose of the present invention to simplify initial semiconductor memory chip test screening.

It is yet another purpose of the present invention to simultaneously select multiple word lines to a RAM array.

SUMMARY OF THE INVENTION

The present invention is a method of testing a RAM. The RAM array is arranged in rows and columns. The rows are grouped into word line groups. The method includes the steps of: a) asserting an array select signal; b) selecting a group of rows in the array; c) selecting at least one row of the selected group of rows; and, d) repeating steps b and c until all of the groups are selected. Array Sense Amps may be set when the first group is selected and remain set until the last group is selected. In one test, word lines in all of the selected rows are activated and remain activated until the final selected row is selected. In a second test, word lines in selected groups are toggled with RAS. If a group contains a known defective word line, that group is either not addressed or its selection is disabled. In each selected group, one row, alternating rows or, all of the rows may be selected.

DESCRIPTION OF THE PREFERRED EMBODIMENT

The present invention is a semiconductor memory with a row decoder with an address enabled latch that, once latched, remains set until reset. Setting the decoder latch enables individual selection of each of a plurality of word lines through individual addresses. A sense-amplifier (SA) is set after turning on the first of the plurality of word lines. The word lines are restored low when a reset signal resets the enable latches, thereby disabling the decoders, returning them to their unselected state.

Figure 3A:
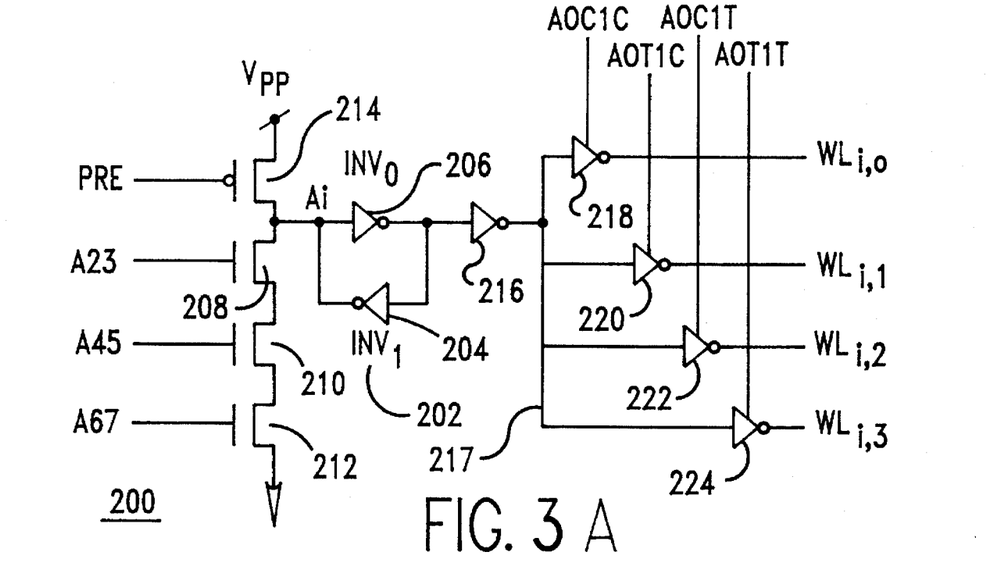
FIGS. 3A–E are a schematic diagram of a latched row decoder and partial address decoders according to the preferred embodiment of the present invention.

FIG. 3A is a schematic diagram of a latched row decoder 200 according to the present invention. The latched row decoder 200 is a word line decoder in a 256 MB DRAM with 256 word-lines in each subarray. The latched decoder 200 of the present invention includes a latch 202 (cross coupled inverters 204 and 206), address select logic (NFETs 208, 210, and 212), a reset device (PFET 214), a latch buffer 216 and 4 gated word line drivers 218, 220, 222, and 224. For 256 word lines $WL_{i,0-3}$ there are 64 (i=0 to 63) such latched decoders 200.

Figure 3B:
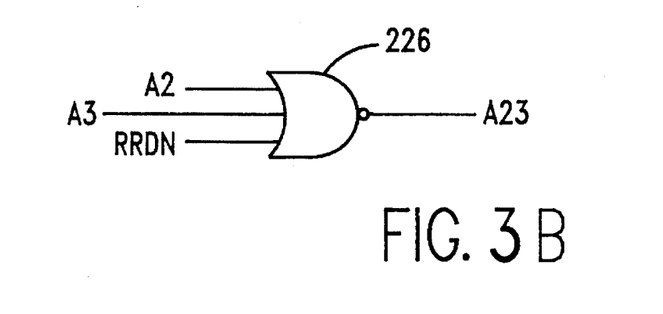
Figure 3C:
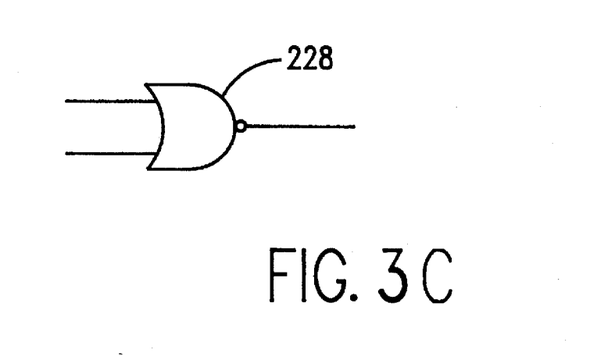
Figure 3D:
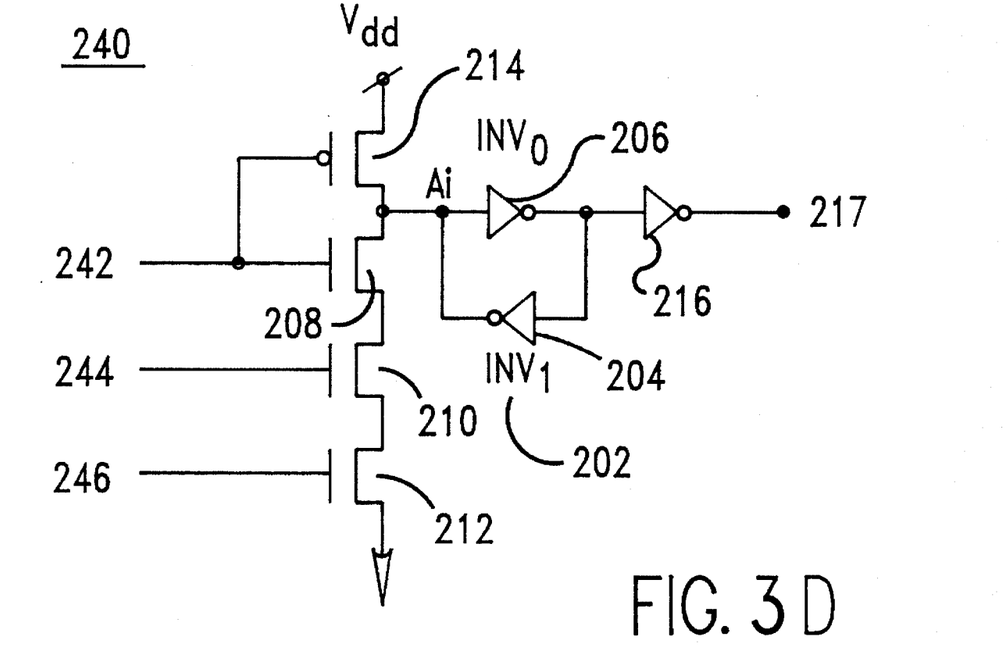

The latched decoder 200 is selected by turning on the three NFETs 208, 210, and 212 in the address select logic. These three NFETs 208, 210, 212 form a three way NAND gate and are turned on by driving high each of A23, A45, and A67, respectively. A23 is a partially decoded address signal from a partial decoder (a three way NOR gate) 226 in FIG. 3B. A45 and A67 are each partially decoded address signals from a two way NOR gate 228 in FIG. 3C. A4, A5, A6 and A7 are inputs to 230 or 232 to generate A45 or A67 on 234, as appropriate.

The word line address bits are paired, 01, 23, 45, and 67, and the pairs partially decoded as A01, A23, A45, and A67, respectively, in partial decoders 226, 228 and 240. Each A23 partial decoder 226 may be disabled by a Row Redundancy Disable Not (RRDN) signal, thereby preventing selection of defective word lines even during multiple word line tests. RRDN remains low, normally, and is driven high only to disable the A23 partial decoders if a previously replaced-defective row is selected. This avoids the problem in selecting these defective word lines inherent in prior art DRAMs. Each partial decoder input (e.g. A2 or A3) is a true or complement each from an address receiver such that A2 is either A2T or A2C and A3 is either A3T or A3C. There are 16 partial decode signals. These partially decoded signals are represented by A01, A23, A45, or A67 wherein:

A01=A0C1C, A0T1C, A0C1T, or A0T1T

A23=A2C3C, A2T3C, A2C3T, or A2T3T

A45=A4C5C, A4T5C, A4C5T, or A4T5T

A67=A6C7C, A6T7C, A6C7T, or A6T7T

Each one of the four word line drivers 218, 220, 222, and 224 are selected by A01. A01 is generated in a latched partial decoder 240 in FIG. 3D. The latched partial A01 decoder 240 is functionally identical to the three-way NAND gate and latch of FIG. 3A except that reset PFET 214 and decode NFET 208 are both driven by a common reset signal, $\overline{WL}$ $\overline{RESET}$ at 242. A0 and A1 are connected to gates 210 and 212 at 244 and 246, respectively, and combined to generate A01. Preferably, the A01 partial decoder 240 output 217 drives a level shifter (not shown) which, in turn, inverts and shifts A01 from $V_{dd}$ at 217 to $V_{pp}$ for word line drivers 218, 220, 222 and 224 (250 in FIG. 3E).

Figure 3E:
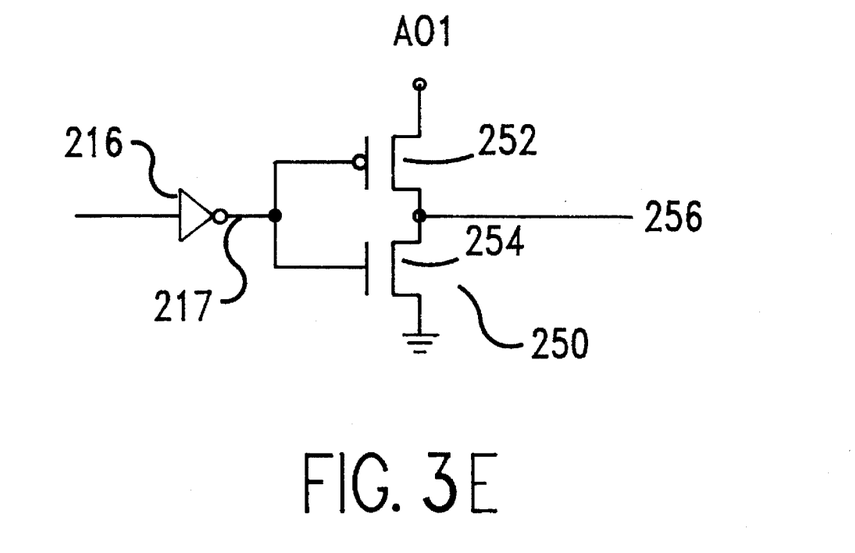

The word line driver 250 is a PFET 252 and NFET 254. As represented in FIG. 3E, the gates of both FETs 252, 254 are driven by latch buffer 216 output 217. The NFET 254 is connected, drain to source, between the word line 256 and ground. The PFET 252 is connected, drain to source, between A01 and the word line 256. When the row decoder latch 202 is reset, 217 is high turning NFET 254 on, holding the word line low, and turning PFET 252 off, isolating the word line 256 from A01. When the decoder latch 202 is set, 217 is low turning NFET 254 off, isolating the word line 256 from ground, and turning on PFET 252, coupling the word line 256 to A01.

Thus as the addressed row decoder latch 202 is set by turning on NFETs 208, 210 and 212 to pull Ai low. Latch inverter 206 inverts the low on Ai. Latch buffer 216 reinverts the output of inverter 206 to provide a low to the input of all 4 inverting word line drives 218, 220, 222, and 224. Each word line driver 218, 220, 222, and 224 in FIG. 3E; drives a word line high when its respective gate input A0C1C, A0T1C, A0C1T, or A0T1T from its respective latched partial decoder 240 is driven high. The row decoder latch 202, once set, remains set until PRE is driven low, turning on PFET 214, which resets the latch 202.

Each WL is actively held high or low by its respective word line driver. So, the WL latch, required to clamp unselected word lines low on prior art RAMs, is obviated by the present invention. Further, as a decoder is enabled, four WLs are partially selected simultaneously.

There are 5 modes of operation for a RAM with a latched row decoder according to the present invention. Besides the normal random access mode, there are 4 test modes. These test modes are: long-$t_{RAS}$ WL disturb mode; toggled WL disturb mode; transfer-gate stress mode; and WL stress mode.

Figure 4:
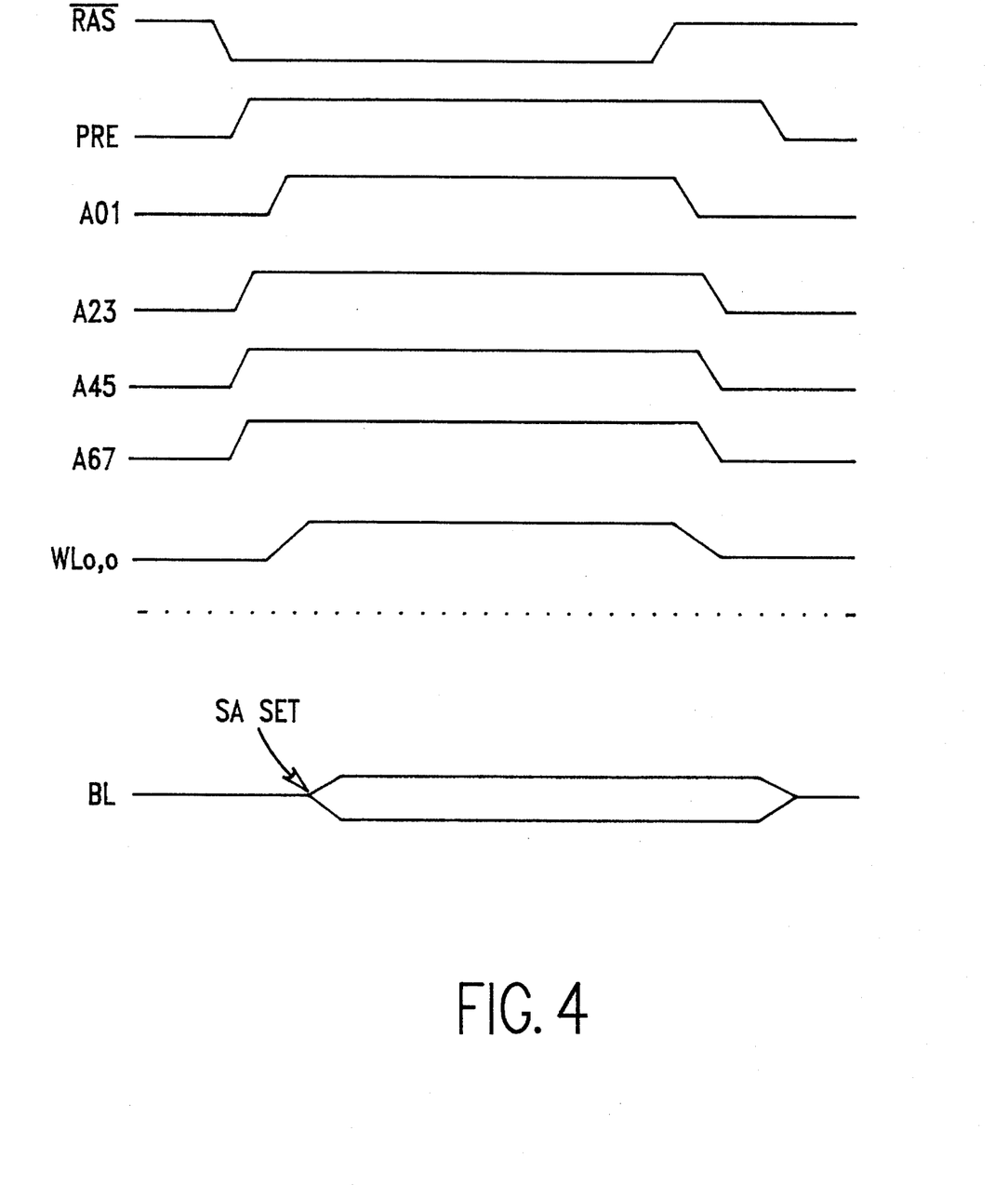
FIG. 4 is a normal random access timing diagram of a RAM including the latched row decoder of FIG. 3.

FIG. 4 is a timing diagram for a random access mode of operation. In stand-by, partially predecoded addresses A23, A45, A67, and reset signal PRE are low, precharging the decoder nodes $A_i$ to $V_{pp}$. Partially predecoded addresses A01 are also low, and so, consequently, are all the 256 word lines $WL_{i,0-3}$. The array access begins when $\overline{RAS}$ goes low. PRE of a selected sub-array rises to disable therein, the decoder reset. Subsequently, one of each of the partially decoded addresses (e.g. A2C3C, A4C5C, and A6C7C) rise. As a result, one decoder $A_i$ ($A_0$) out of 64 is pulled low setting its latch. Setting the latch partially selects a group of four of the 256 word lines (i.e. $WL_{0,03}$). One of this group is selected by one of the partially predecoded addresses A01 (e.g., A0C1C) rising. The selected word line ($WL_{0,0}$) is thus driven high. The sense amplifiers are set normally.

After the array is accessed, all predecoded signals A01, A23, A45, A67, and PRE are reset low when $\overline{RAS}$ rises. During reset, the previously set latch is reset by the low on PRE so that $A_i$ is pulled to the $V_{pp}$ through PFET 214. Also, the previously selected WL (i.e. $WL_0$) is restored low.

Testing a RAM with the preferred embodiment latched row decoder is improved significantly over prior art RAMs. To facilitate understanding of the advantages of the present invention, timing diagrams for multiple word line tests are provided for each of the above tests both on prior art RAMs and for testing a RAM with the latched row decoder of FIG. 3.

Figure 5:
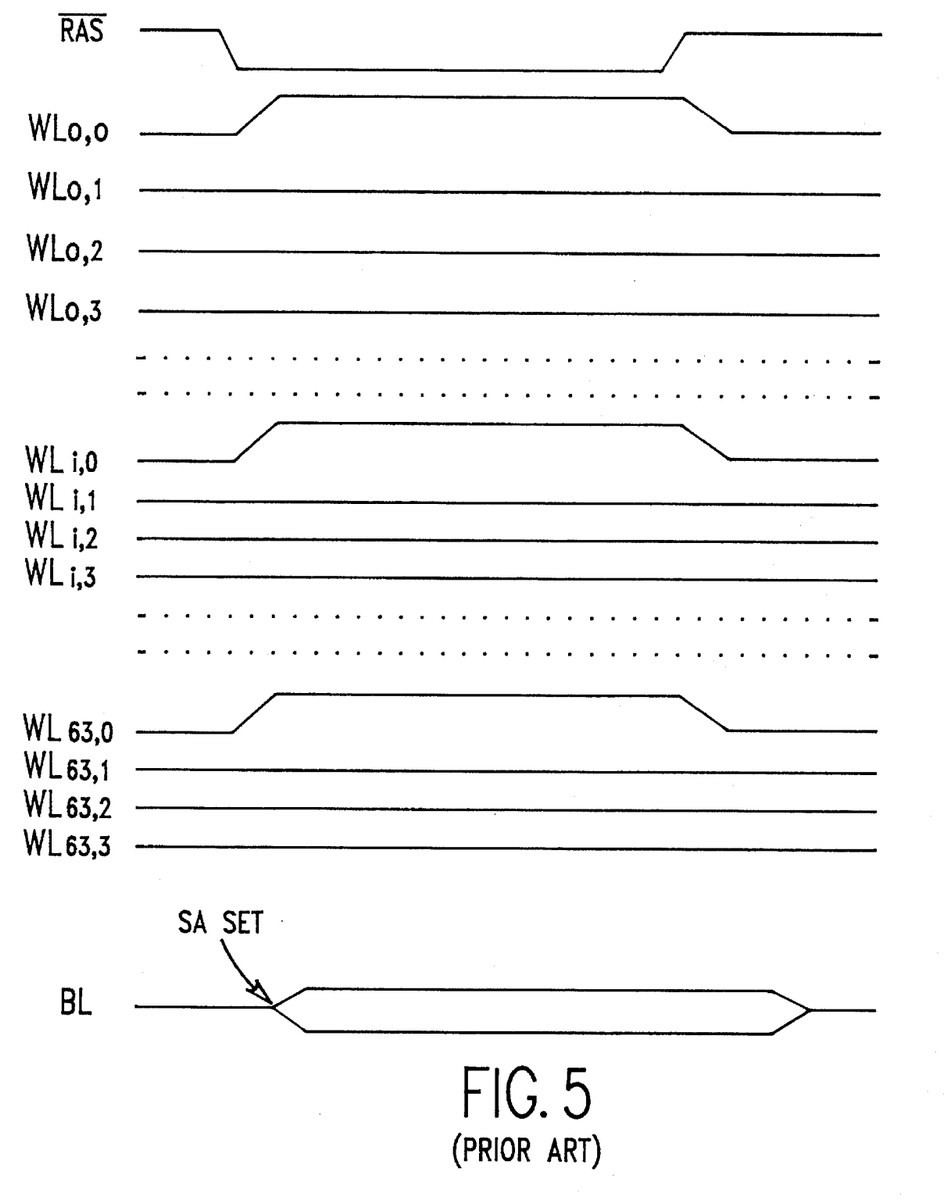
FIG. 5 is a timing diagram for prior art multiple word line select test.

FIG. 5 is a timing diagram for a prior art multiple word line long $t_{RAS}$ disturb test. In this prior art test, when $\overline{RAS}$ falls, 64 word lines $WL_{i,0}$ are driven high simultaneously. The sense amps are set shortly thereafter. All of the cells on activated wordlines are turned on and sensed simultaneously. This simultaneous cell switching induces noise onto the cell's plate voltage and on $V_{pp}$. Noise current and resistance on $V_{pp}$ and on the plate hampers testing and reduces the reliability of this test on this prior art RAM.

Figure 6:
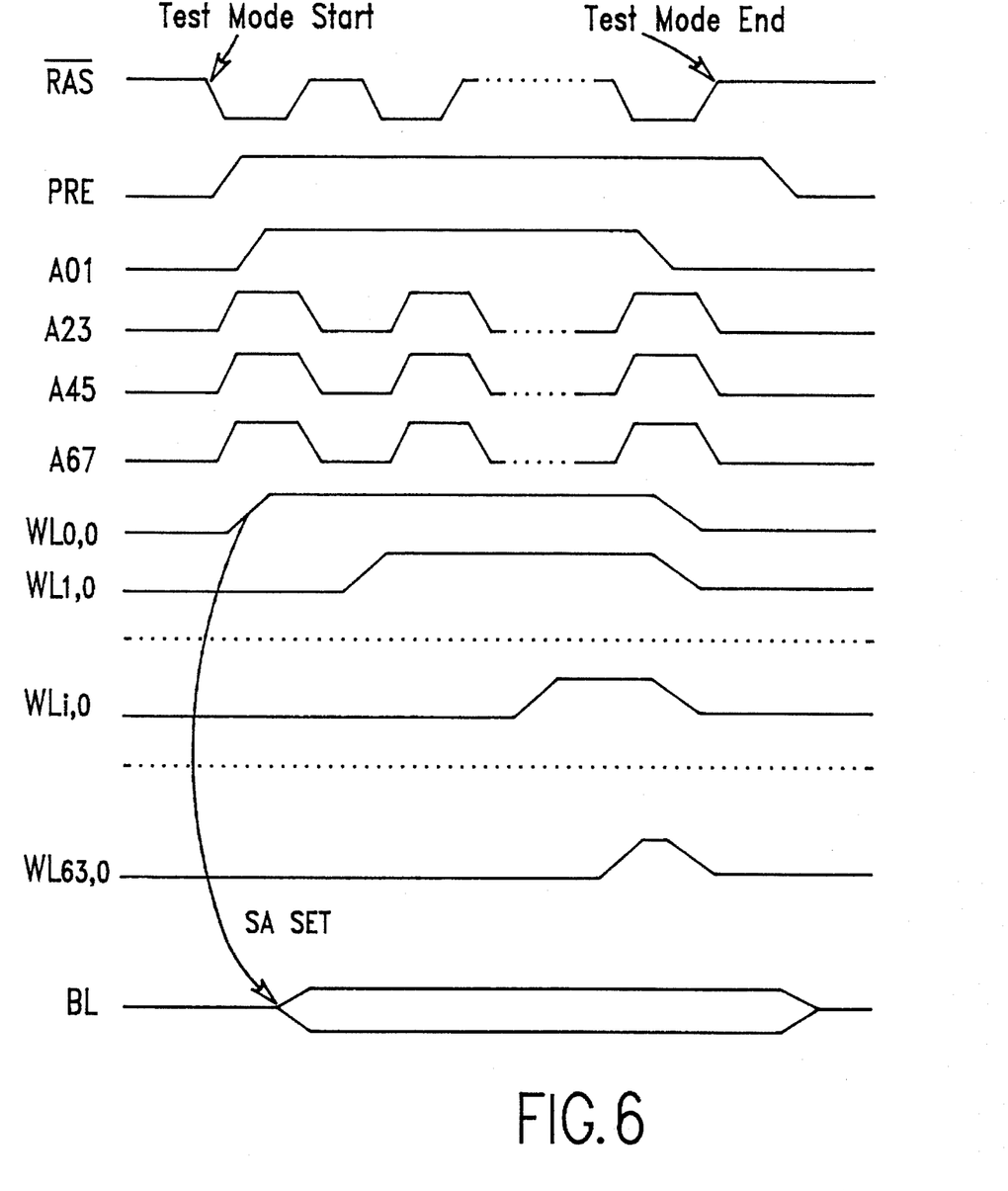
FIG. 6 is a timing diagram for a first multiple word line select (long $t_{RAS}$ disturb) test according to the present invention.

By contrast, FIG. 6 is a long $t_{RAS}$ disturb test according to the present invention wherein latched row decoder circuits are sequentially selected and, as selected, latched. Each latched decoder enables groups of 1 to 4 selected word lines. In this test, the sense amplifiers are set after the first WL has been selected. To further stress the RAM, the bit-lines may be grounded by forcing precharge voltage $V_{pre}$ to ground (GND) through the bit-line equalizers, after all 64 decoders have been selected and latched. The number of selected word lines and their activation sequence is selected, externally, at the tester. Also, PRE is externally controllable by the tester so that the tester independently resets the latches. Thus, because the number of activated word lines and set sense amps is the same during each subsequent selection in this test as for a normal random access, (i.e., the normal number of word lines, bit lines and sense amps are switching) this test is no less reliable than a normal read or write and, is significantly improved over the prior art.

At the beginning of the long $t_{RAS}$ disturb test, when the chip is enabled ($\overline{RAS}$ low), PRE rises and remains high to disable the $A_i$ decoder latch reset. Subsequently, partially decoded addresses (e.g. A2C3C, A4C5C, and A6C7C) rise as in the random access mode. As a result, one decoder $A_i$ (e.g. $A_0$) out of 64 is pulled low and latched. This set latch selects four out of 256 WLs, in this example, $WL_{0,0}$. One of the partially predecoded word line driver addresses A01, such as A0C1C, rises enabling one of the four partially selected word line drivers, which drives word line $WL_{0,0}$ high. Then, the sense amplifiers are set, normally, as for a normal random access. After this first access during the long $t_{RAS}$ word line disturb test, PRE remains high, even when $\overline{RAS}$ is high, so that selected word lines remain selected. In each subsequent RAS cycle, another latch is set as partially decoded addresses (e.g. A2T3C, A4C5C, A6C7C) rise. As each latch is set, another group of word line drivers are partially selected and, therefore, another word line is driven. Previously set latches remain set and previously active word lines remain active. This sequence is repeated until all the word line decoders have been enabled, or the test complete.

Once the test is complete the active word lines are reset by first pulling A01 low. Because the A01 level shifter are each designed to charge and discharge a single WL in normal operation, the instantaneous ground current during reset is limited by these level shifters, which each discharge a major portion of the selected word lines. So, A01 is pulled low, discharging the word line through the word line drivers 218, 220, 222, and 224. When the word line falls to the $V_{tp}$, discharging stops. When PRE falls, the latch is reset as latch nodes $A_i$ are pulled to $V_{pp}$. Resetting the latches resets the row decoders and discharges the residual word line voltage ($V_{tp}$) to ground through NFET 259. Finally, the sense amplifiers are reset, normally.

This long $t_{RAS}$ disturb test requires one RAS cycle per word line selected ($\approx$100 ns). However, the test time is still significantly shorter than the cell retention time (256 ms), even allowing for a thousand RAS test cycles.

Figure 7:
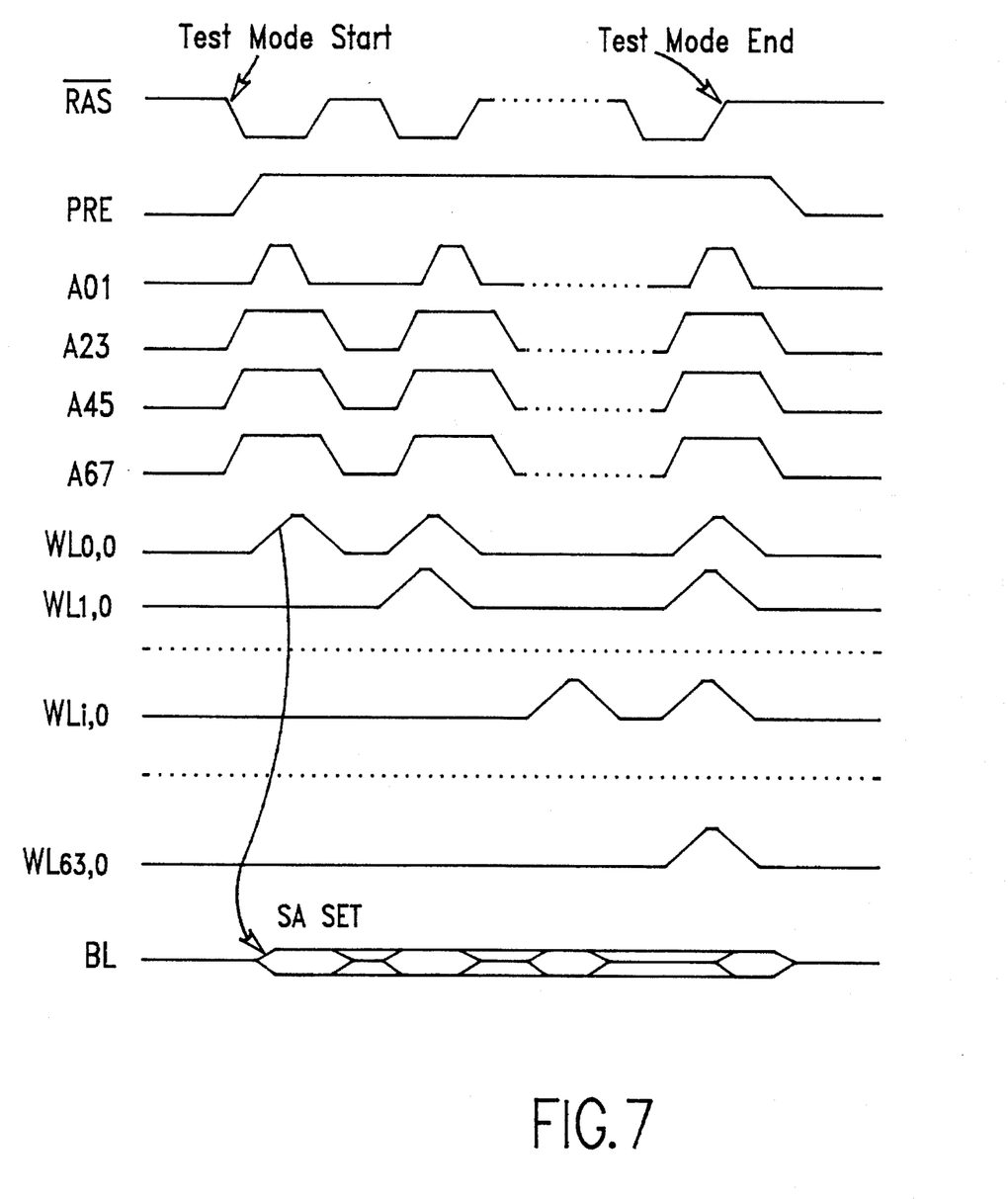
FIG. 7 is a timing diagram for a toggled word line disturb test according to the present invention.

FIG. 7 is the toggled multiple word line disturb test according to the present invention wherein each latched row decoder is sequentially selected and, for this test, $\overline{WL_{RESET}}$ is toggled with $\overline{RAS}$, which in turn toggles A01. As each decoder latch is set, it remains set. So, the enabled word lines are all toggled with $\overline{RAS}$. The sense amplifier may be set when the first latch is set, or, alternatively, set and reset with the toggled word lines. As with the long $t_{RAS}$ disturb test, the word line group size and their activation sequence is controlled externally at the tester. Should $V_{pp}$ noise be a concern because of toggling too many word lines, simultaneously, the number of simultaneously toggling (selected) word lines may be reduced by the tester.

Figure 8:
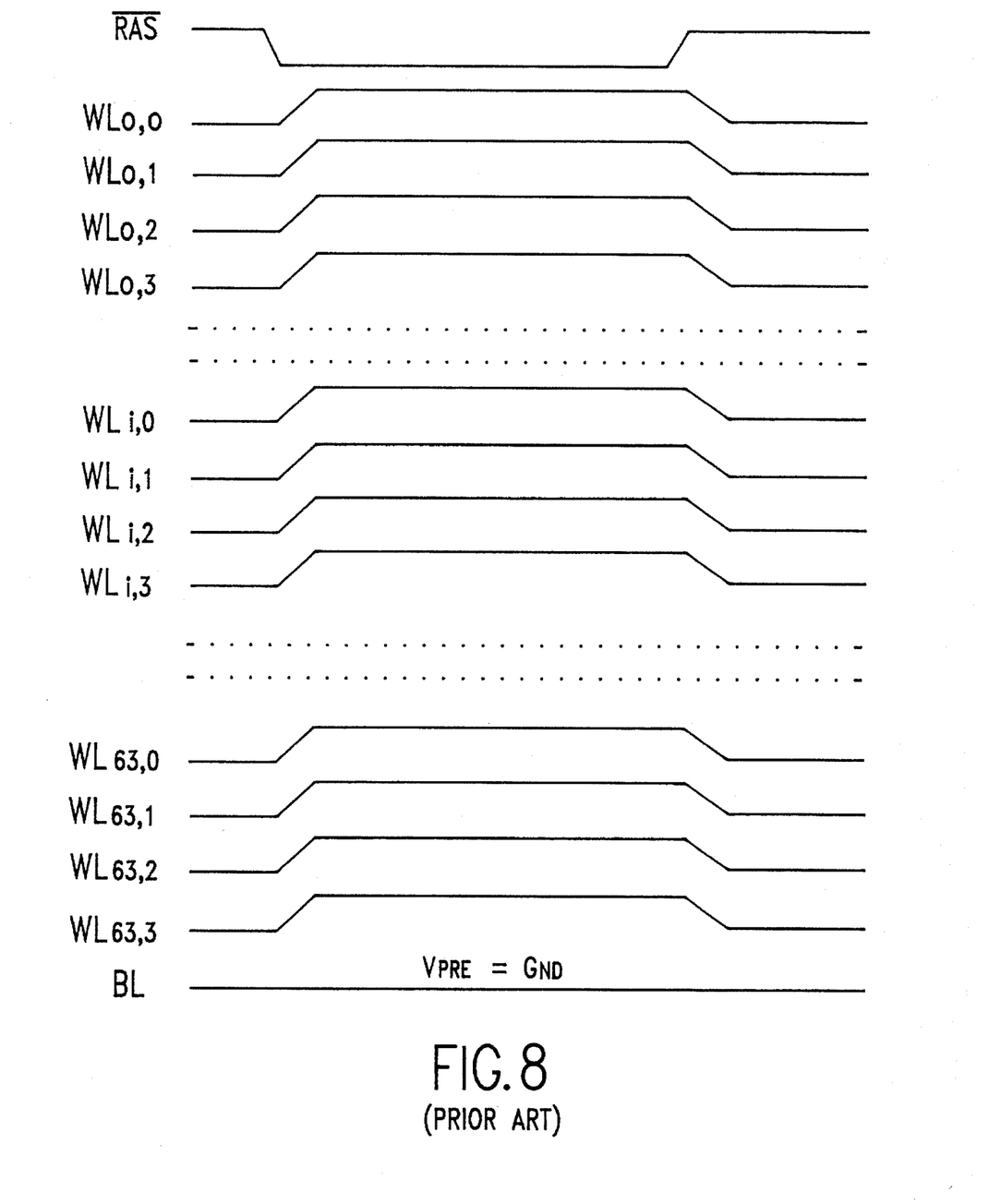
FIG. 8 is a timing diagram for a prior art transfer gate stress test.

FIG. 8 is a timing diagram for a prior art transfer gate stress test. In this DC test, all 256 word lines in a Sub-array are selected and driven high, simultaneously. Coincidentally with driving the word lines, the bit line precharge voltage $V_{pre}$ is forced to ground. This prior art test is hampered by simultaneous switching and, especially, by ground bounce.

Figure 9:
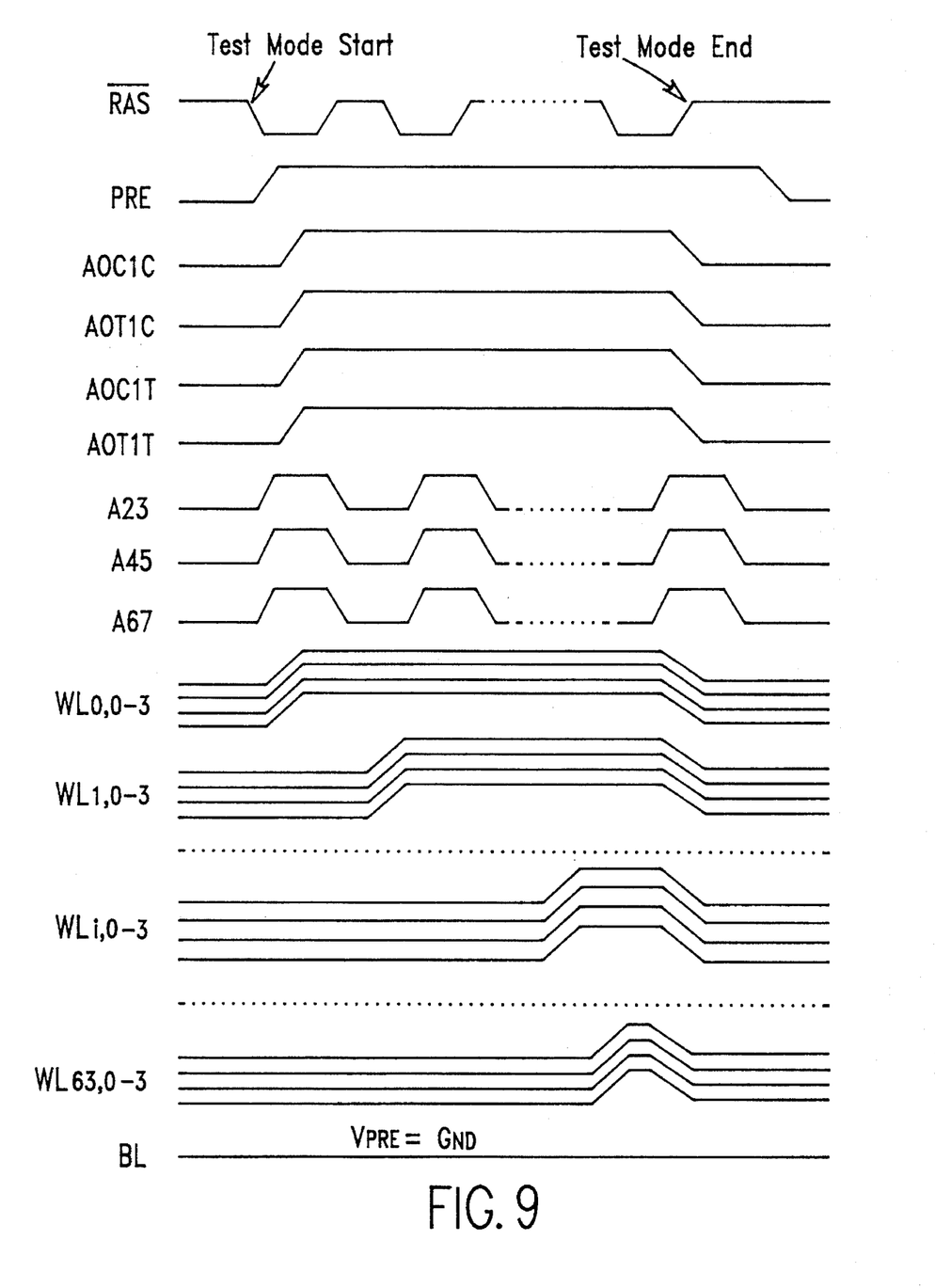
FIG. 9 is a timing diagram for a transfer gate stress test according to the present invention.

FIG. 9 is a timing diagram of a transfer-gate stress test according to the present invention. In this test, all four A01 signals are held high, enabling all four drivers of any enabled row decoder. $\overline{RAS}$, PRE, A23, A45, and A67 are toggled to sequentially set row decoder latches. Each group of four word lines ($WL_{i, 0-3}$) is sequentially enabled and all four word lines are driven high. In this test as in the prior art test of FIG. 8, the sense amplifiers are not set. Instead, the bit-lines are forced to GND through the bit-line equalizers by forcing $V_{pre}$ to ground. Also, defective word lines are disabled to avoid the $V_{pp}$ drop across the short otherwise encountered in prior art DRAMs, and thereby, significantly improving test reliability.

Figure 10:
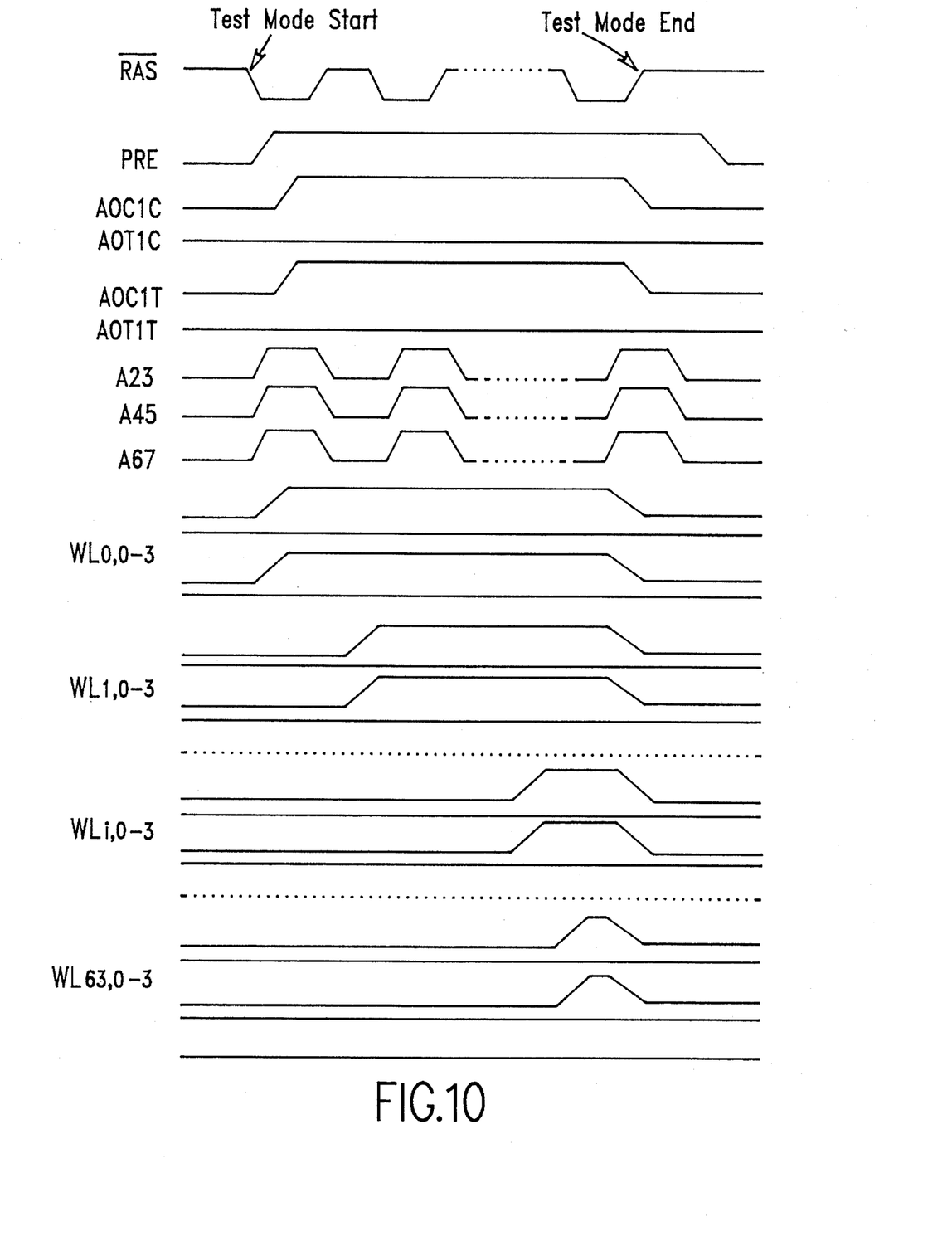
FIG. 10 is a timing diagram for a word line stress test according to the preferred embodiment of the present invention.

FIG. 10 is a timing diagram for the word line stress test according to the present invention. This test is similar to the transfer gate stress test. However, alternating word lines are selectively activated by 2 instead of 4 A01 signals (e.g. A0C1C and A0C1T). In this test, alternating word lines are forced high ($V_{pp}$) and low (GND) providing maximum electric field between adjacent word lines. WL to WL shorts may be identified or, may form, between word lines during this test. So, $\overline{RAS}$, PRE, A23, A45, and A67 are toggled as in the long-$t_{RAS}$ word line disturb test FIG. 6. The latches are set sequentially and, as each latch is set, alternating word lines (e.g. $WL_{i,0}$ and $WL_{i,2}$) are selected and driven sequentially. Once activated, the word lines stay active such that, eventually an alternating high/low world line pattern results.

For these 4 tests, known defective word lines may be disabled by gating the partial addresses with the redundancy control signal RRDN or, prior to fuse programming, by masking the address at the tester. As noted above, in prior art RAMs, during test, all the word lines switched simultaneously. However, the preferred latched row decoders allow gradually selecting all or many of the word lines, so that only a small fraction of word lines switch in a selected sub-array during in any RAS test cycle. Therefore, $V_{pp}$ line noise is minimized, eliminating the need for external $V_{pp}$ supply.

Also, plate coupling noise, from bit-line sensing during the WL disturb test, is minimized, because the sense amplifiers are set after the first word lines is selected. So the bit lines remain in a steady state, as driven in response to data from the first word line. Additionally with the decoder of the present invention, after two or more decoders have been enabled, multiple Word Lines (those enabled) may be toggled for AC testing. Switching-current induced ground-bounce, that might result from discharging multiple word lines simultaneously, is also reduced by reducing bit line and word line switching during tests.

Furthermore, the tester can control the number of active word lines, their selection and their activation sequence. Thus, the present invention has significant test mode flexibility. Prior to fuse programming to replace known defective word lines, the tester can use previous test results to mask out the known bad row addresses. Also, after identifying and replacing defective word lines, defective word lines are by-passed by gating the row decoder select signals with redundancy compare signals. Thus if a row address matches a replaced WL, then that address is blocked, and not sent to the row decoders.

Finally, an array including this latched decoder can be stressed for burn in or for reliability analysis by of all word lines or, alternating word lines active for extended periods of time.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. A method of testing a RAM array, said array being arranged in rows and columns, said rows being grouped into a plurality of groups, said method comprising the steps of:

a) asserting an array select signal and disabling a reset signal;

b) selecting a group of rows in said array;

c) selecting at least one row of said selected group of rows;

d) repeating steps b and c until all of said groups are selected; and, e) comparing measured array data with expected data.

2. The method of claim 1 further including after the step (c) of selecting at least one row, the step of:

c1) setting sense amplifiers.

3. The method of claim 1 further including after the step (c) of selecting at least one row, the step of:

c1) grounding a plurality of bit lines in columns of said array.

4. The method of claim 1 wherein the step (d) of repeating steps b and c further includes toggling said array select signal.

5. The method of claim 4 wherein the step (d) further includes toggling said word line driver enable.

6. The method of claim 1 wherein the sep (b) of selecting the group of rows further includes disabling selection of a first group of rows and selecting a second, redundant group of rows.

7. The method of claim 1 wherein each group is a group of 4 rows and said at least one row is one row.

8. The method of claim 1 wherein each group is a group of 4 rows and said at least one row is two rows.

9. The method of claim 1 wherein each group is a group of 4 rows and said at least one row is four rows.

* * * * *